United States Patent [19]

Beeman

[11] 4,387,337
[45] Jun. 7, 1983

[54] GROUND LOCATING DEVICE FOR CATHODICALLY PROTECTED STEEL PIPING AND/OR ELECTRICAL CONDUITS

[76] Inventor: Terrence M. Beeman, 183 MacAuley Crescent, Winnipeg, Manitoba, Canada, R2G 0P6

[21] Appl. No.: 201,167

[22] Filed: Oct. 27, 1980

[30] Foreign Application Priority Data

Nov. 7, 1979 [GB] United Kingdom ............... 7938492

[51] Int. Cl.³ .......................................... G01R 31/08
[52] U.S. Cl. ..................................... 324/52; 375/59; 455/112
[58] Field of Search ............... 324/52, 66, 67; 455/40, 455/112; 375/59, 66

[56] References Cited

U.S. PATENT DOCUMENTS

| 2,315,383 | 3/1943 | Andrews | 324/52 |
| 2,731,598 | 1/1956 | Herbert | 324/52 |
| 3,846,705 | 11/1974 | Davis | 375/59 X |
| 3,904,839 | 9/1975 | Peoples | 324/52 X |

FOREIGN PATENT DOCUMENTS 1172683 12/1969 United Kingdom .................. 324/52

Primary Examiner—Stanley T. Krawczewicz
Attorney, Agent, or Firm—Stanley G. Ade

[57] ABSTRACT

The device consists of a transmitter and a receiver. The transmitter utilizes multiple frequencies generated by a binary counter divider and includes a carrier frequency, an I.F. frequency, an audible tone frequency, a frequency which gives the ability to use battery power efficiently and a frequency which gives the ability of easy interpretation of the results. It includes a Norgate controlling the ON and OFF state of a power switch which in turn controls a capacitive driver source through a matching transformer to the "load". The receiver consists of a series of sequential filters each tuned to the three highest encodements of the transmitter and operating a visual and audible transducers on the receiver.

20 Claims, 10 Drawing Figures

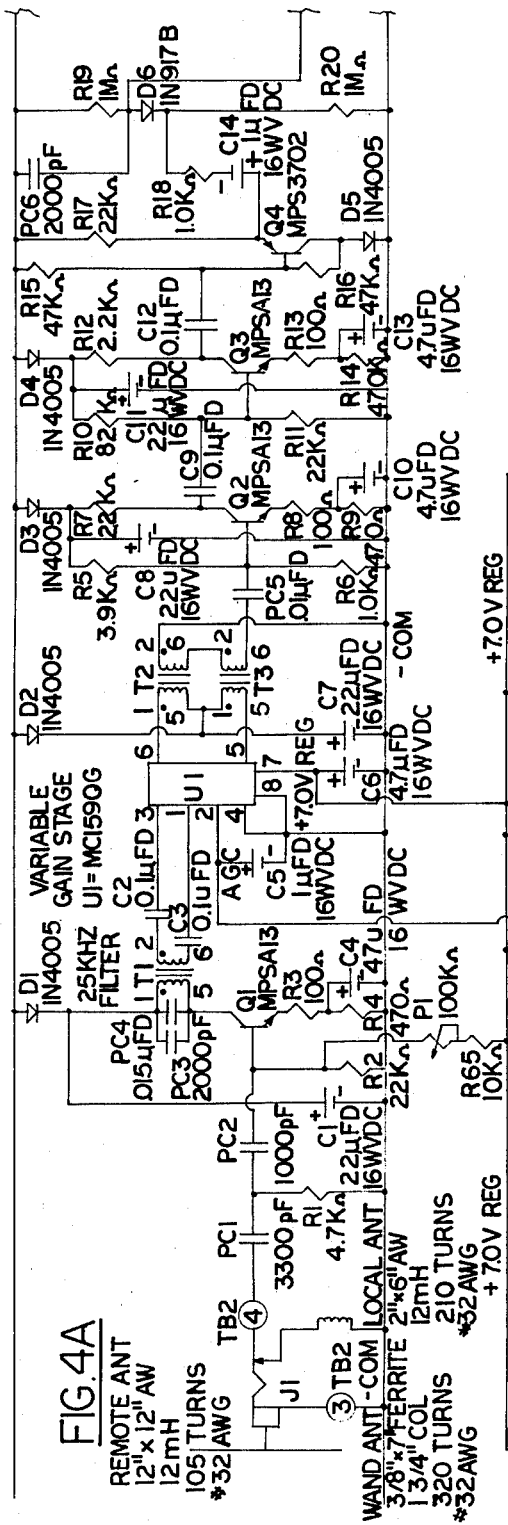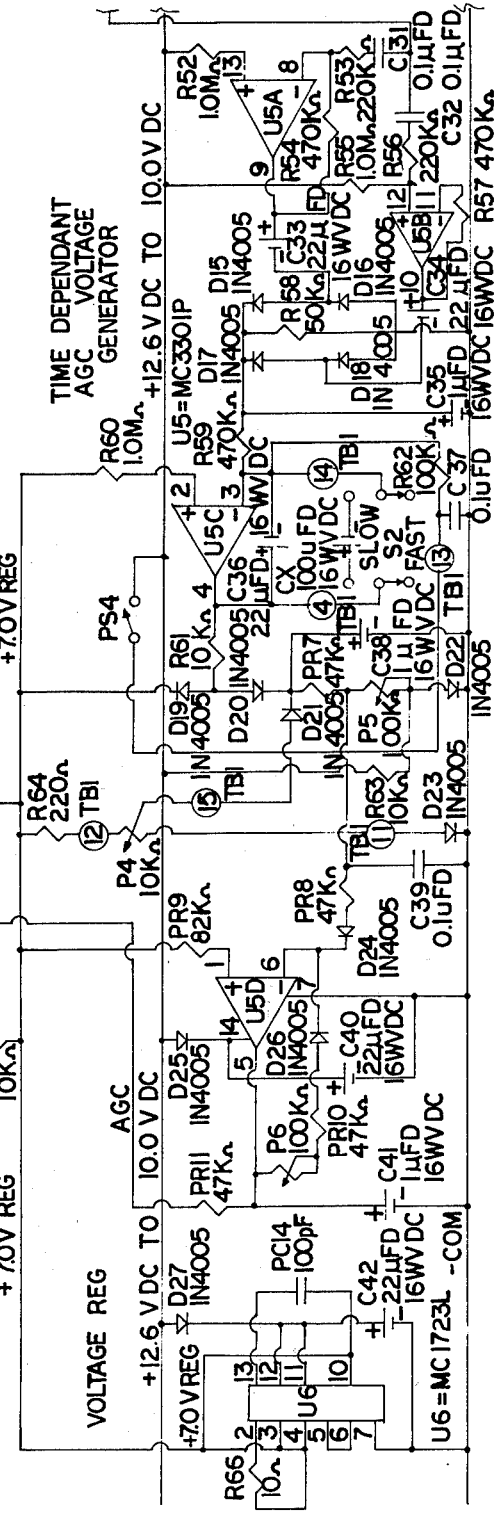

GROUND LOCATING DEVICE FOR CATHODICALLY PROTECTED STEEL PIPING AND/OR ELECTRICAL CONDUITS

BACKGROUND OF THE INVENTION

Distribution facilities such as for gas, petroleum and the like normally utilize cathodically protected steel piping laid in the soil. Cathodic protection is a means of protecting buried coated steel pipe from corrosion by maintaining it at a small voltage (usually less than 1V negative) relative to the surrounding soil.

Such cathodically protected coated steel pipe suffers from this protection being lost through random, unpredictable and numerous grounds. A ground is any direct contact with other structures or with the soil itself, thereby shorting out the coating, and which drains away the protective electricity thus exposing the protected material to corrosion. Gas, oil and other hazardous fluid lines are particularly vulnerable because corrosion occurs in small areas which results in leaks which are much more dangerous and costly than the actual material damage to the conduit.

Every such ground starts the entire connected section of pipe, large or small, on which it occurs, on a demonstrable "corrosion leak curve" which, rising on a log-log progression will, if unchecked, destroy the pipe past repair in a predictable number of years. Although this curve varies, there are few, if any, cases where such corrosion damage is acceptable for the life of the type of conduit.

It is therefore usual for a gas or oil distribution utility or the like to practice corrosion control by endeavoring to check the maintenance of the cathodic protection on a regular basis.

This means, in practice, endeavoring to locate and repair ground faults by means of instrumentation presently available. As an example, cathodic protection maintenance at the Greater Winnipeg Gas Company, Winnipeg, Manitoba, Canada, means, in practice, locating and repairing grounds in underground piping, which may number between 700 and 900 a year on 1,200 miles of distribution mains even although these distribution mains are provided with supposedly ground-avoiding designs i.e. coating on the steel pipe, backed up with cathodic protection.

Prior to 1960, the main method for locating grounds was to test the soil voltage gradients. Then an AC caliper device was offered to check services in series down a given street to locate any that were conveying an AC hum.

Around 1960, the Nilsson pipe and cable trace (Wahlquist patent) was used, the signal of which was ground seeking and could be so traced to the point of the nearest ground. Up until the present time, this has been the most efficient method of locating such grounds. As mentioned previously, it is based on the Wahlquist patent which is an adaption of the Pearson method for tracing soil currents. A ground seeking audio frequency signal is injected into one point of the pipe and then the course of the signal is followed with a receiver. The principal limitation is the frequent ambiguity of the operators indication. Furthermore, the receiver is subject to various electronic noises so that in general, it has been found to be unsatisfactory in some areas. Presently, a model has been substituted in which the signal is in some ways even less than satisfactory.

A technician can possibly cover 100 sections in a day for the status of cathodic protection. A repair crew may be able to eliminate located grounds in an average of about ½ hour. The work of finding each ground in a section comprising 10 blocks or more averages about 2½ hours and can require as much as a week to check thoroughly. Hence, the present state of the art is not satisfactory from the viewpoint of the user.

Firstly, the original or old Wahlquist design, which is marginal at best in ground seeking, has been replaced by a solid state device that is an improvement when used as a pipe and cable tracer, but is not claimed to be effective in tracing grounds.

Secondly, most designs, including the Wahlquist, are subject to various types of interference, particularly 50/60 cycle AC hum, which is usually present in the main and is often stronger than the impressed signal. Furthermore, ignition noise of vehicles acts as a severe interference.

Thirdly, when using instruments, the speed of operation is limited to the speed at which the operator can traverse the ground and yet still attempt to receive signals. This speed is one mile per hour or less with some instruments.

SUMMARY OF THE INVENTION

The present device overcomes the disadvantages inherent in current designs in that it provides a signal which is ground seeking with a sharp indication when the ground fault is intercepted.

The present device is strongly selective and all but immune to extraneous noise and the unit is designed for continuous operation and convenient, portable use.

The present device is designed for use by one man in a patrol vehicle and can also be readily removed and used by hand.

It has proved to be more effective in the ground seeking function when carried in a vehicle traveling at least 5 to 10 miles per hour the present instruments used at a speed of approximately than one mile per hour when walking.

Present pipe or cable tracer designs operate on a single audio frequency with or without a sub-frequency as an interuption rate, or on a higher single carrier frequency (i.e. at some frequency intolerable to the human ear) which is converted in the receiver via Beat Frequency Oscillator (BFO) techniques into an audible signal. Because all present designs operate at a single frequency they exhibit less selectivity or noise rejection than the NorGate transmitter and multi-frequency receiver of the instant device. Single frequency designs do not permit the receivers of same, to operate with such a high gain factor as that permitted in a multi-frequency receiver device, consequently this present device offers much greater sensitivity than current devices.

Current single frequency devices operating in or around 1.0 Khz (audio frequency) suffer inferior noise rejection due to their operating frequency being nearer to the higher power harmonics of 60 Hz (power frequency) or approximately 20 Hz to 30 Hz (the ignition frequency of most cars at 30 MPH). Single frequency audio devices working around 1.0 Khz have inferior ground seeking characteristics due to the fact that, at this frequency, all return paths exhibit approximately the same value of impedance to the transmitter hence shorter paths do not substantially obtain higher values of return current. Single frequency devices in the 100 Khz range of carrier frequency with a 100 Khz BFO receiver exhibit a better noise rejection characteristic than the single frequency audio devices but still are limited in noise rejection by the monolithic nature of a one frequency design, i.e. rise time at one end and pulse width at the other end. The 100 Khz BFO type design also suffers from a lack of range due to the roll off caused by the electrical capacity of the pipe or cable to the surrounding soil, and the gain restrictions of a single frequency design.

By using a NorGate mixer in the transmitter we can combine as many of the frequencies available by binary division of a single primary oscillator (clock generator) as desired. The output of the NorGate mixer is a type of "pulse code modulation" not presently in use. The NorGated composite signal, at the output of the NorGate, carries a detectable characteristic of each of its inputted single frequency components. This singular unique feature of "NorGate type pulse code modulation" permits the use of a multi-frequency filtering in the receiver, at as many frequencies as prove necessary. Because each filtered stage provides isolation, gain can be inserted in each stage possessing a different operating frequency. Consequently the multi-frequency receiver offers a gain of approximately 2000 times greater than that feasible in single frequency audio type receivers, and a gain of approximately 100 times greater than 100 Khz BFO type receivers. Because the primary or carrier frequency of the transmitter is 25 Khz as opposed to 100 Khz, the propogated signal suffers approximately 4 times less degradation due to the electrical capacity to soil of the pipe or cable. However 25 Khz has proved to be high enough in frequency to exhibit preferential treatment to shorter paths such as grounds. This means that the presence of a ground creates a return current at the ground point of sufficient magnitude so as to leave only approximately ½ the current on the pipe beyond the ground as compared to the current on the pipe before the ground. This corresponds to an approximate 3dB drop in the 390 Hz tone output of the receiver once the operator goes beyond a ground fault. Conversly if the operator is coming in towards the transmitter along the pipe, a ground will cause a 3dB rise in the output of the receiver beyond the ground fault.

The amount of difference a fault creates in the output of the receiver is a function of frequency. A carrier frequency of 50 Khz causes severe changes in receiver output when compared to a 25 Khz carrier. Conversly a 12.5 Khz carrier causes the receiver output to change very little when compared to a 25 Khz carrier. The operating range of a 50 Khz NorGated system proved to be too limited to make it commercially viable. The fault finding abilities of the 12.5 Khz NorGated system were so marginal as to make it incompatable with reasons for this instrument. Thus the 25 Khz NorGated system offered the best comprimise, better range, with superior fault annunciation when compared to presently available pipe or cable tracers.

In accordance with the invention there is provided a ground fault locating device for cathodically protected steel conduits and the like comprising in combination a Norgate modulated transmitter and a receiver, said transmitter including:

(a) the source of power, (b) frequency generating means operatively connected to said source of power, (c) means operatively connected to said frequency generating means to produce a plurality of binary divisions of the frequency generated by said frequency generator means, (d) means operatively connected to a selected number of frequencies to produce a composite output therefrom, (e) a power switch circuit, (f) ON and OFF drive means operatively connected to said composite output and said power switch circuit, to control said power switch circuit, (g) a capacity driver source, (h) means to power said capacity driver source operated by said power switch circuit, and (i) means operatively connecting said capacity driver source to the load of said transmitter, said receiver adapted to receive the signals transmitted by said transmitter.

With the foregoing in view, and other advantages as will become apparent to those skilled in the art to which this invention relates as this specification proceeds, the invention is herein described by reference to the accompanying drawings forming a part hereof, which includes a description of the preferred typical embodiment of the principles of the present invention in which:

DESCRIPTION OF THE DRAWINGS

In the drawings like characters of reference indicate corresponding parts in the different figures.

DETAILED DESCRIPTION

Although the device is designed specifically for use with underground coated steel pipes and the like, it is readily usable in locating cable faults and breaks.

When so applied it can be used on all sizes of conductors. If there is a fault on the cable, the device is designed to annunciate its locale. An electrolytic path through a puncture in the cable jacket could be a substantial ground or fault.

The specific function of the present device is to inject a unique form of electrical signal in a selected buried conductor and then to trace this signal along the conductor to locate the exact point where the signal largely dissipates to ground.

Figure 1:
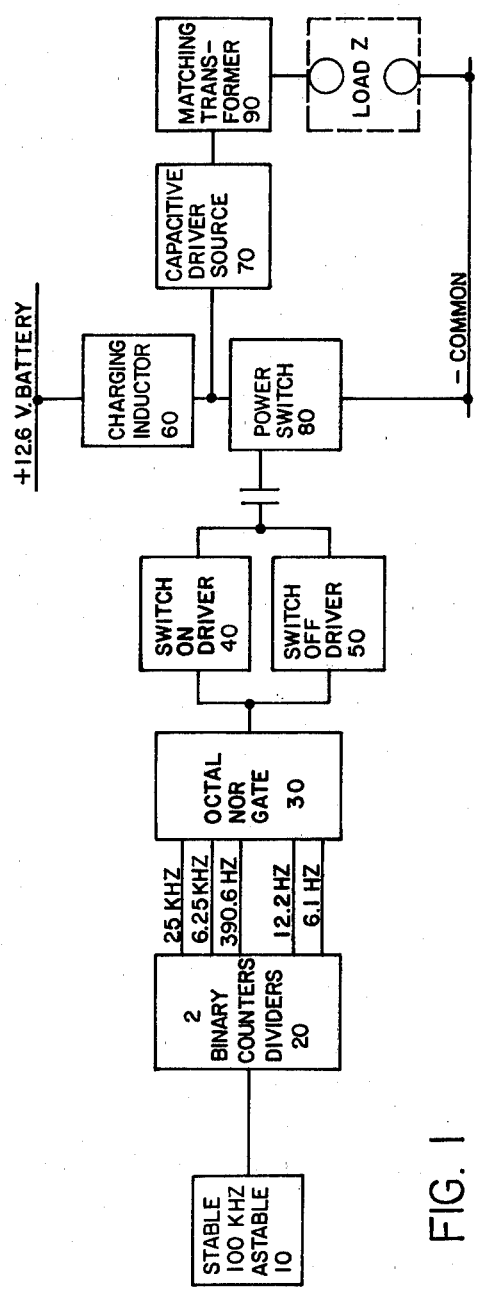
FIG. 1 is a logic block diagram of the transmitter.
Figure 2:
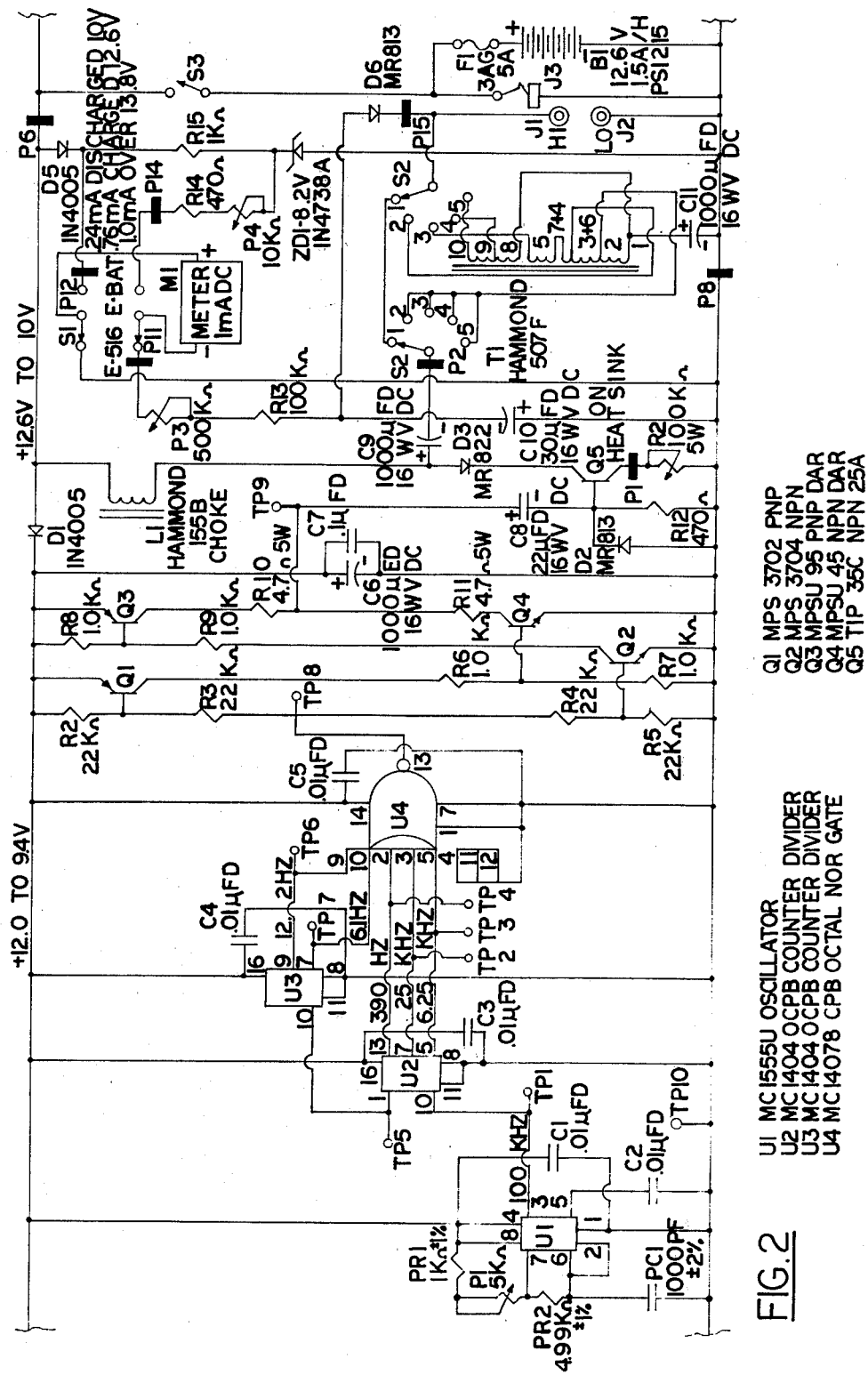
FIG. 2 is a schematic diagram of the transmitter.
Figure 3:
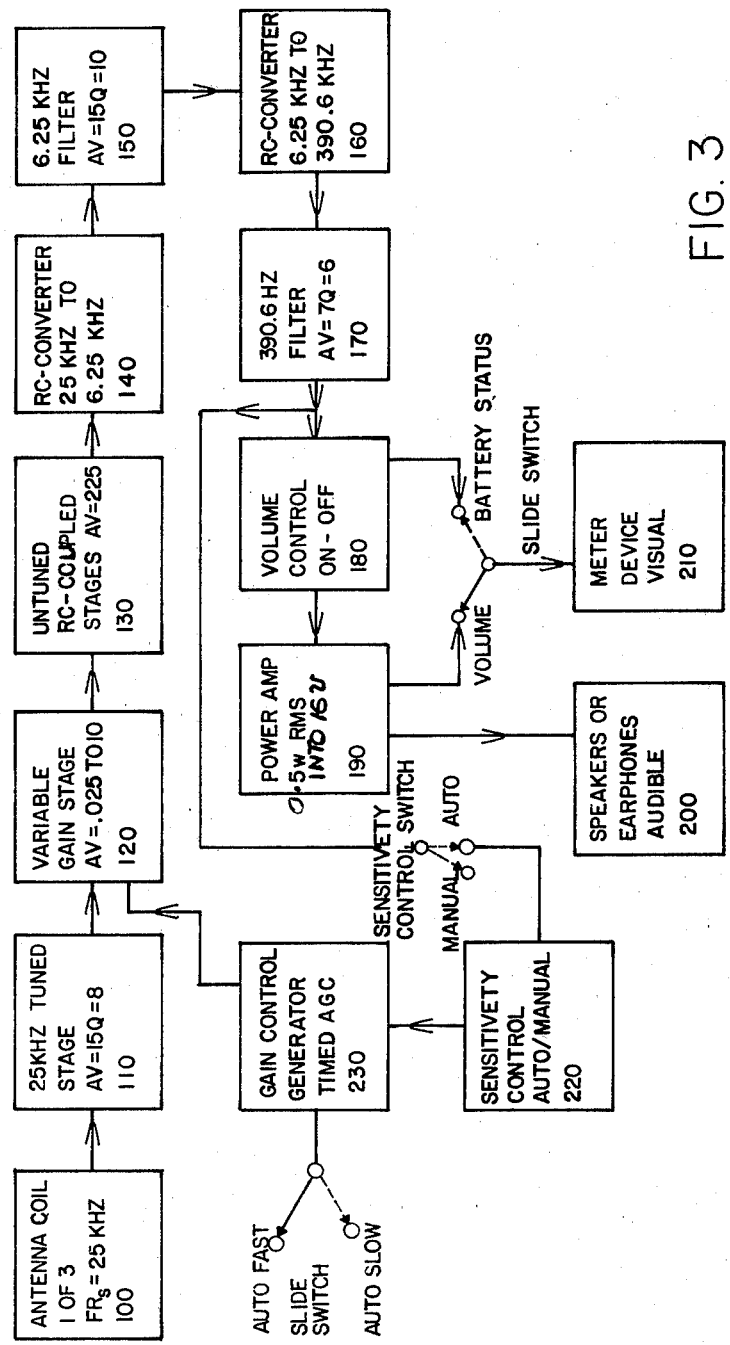
FIG. 3 is a logic block diagram of the receiver.
Figure 4B:
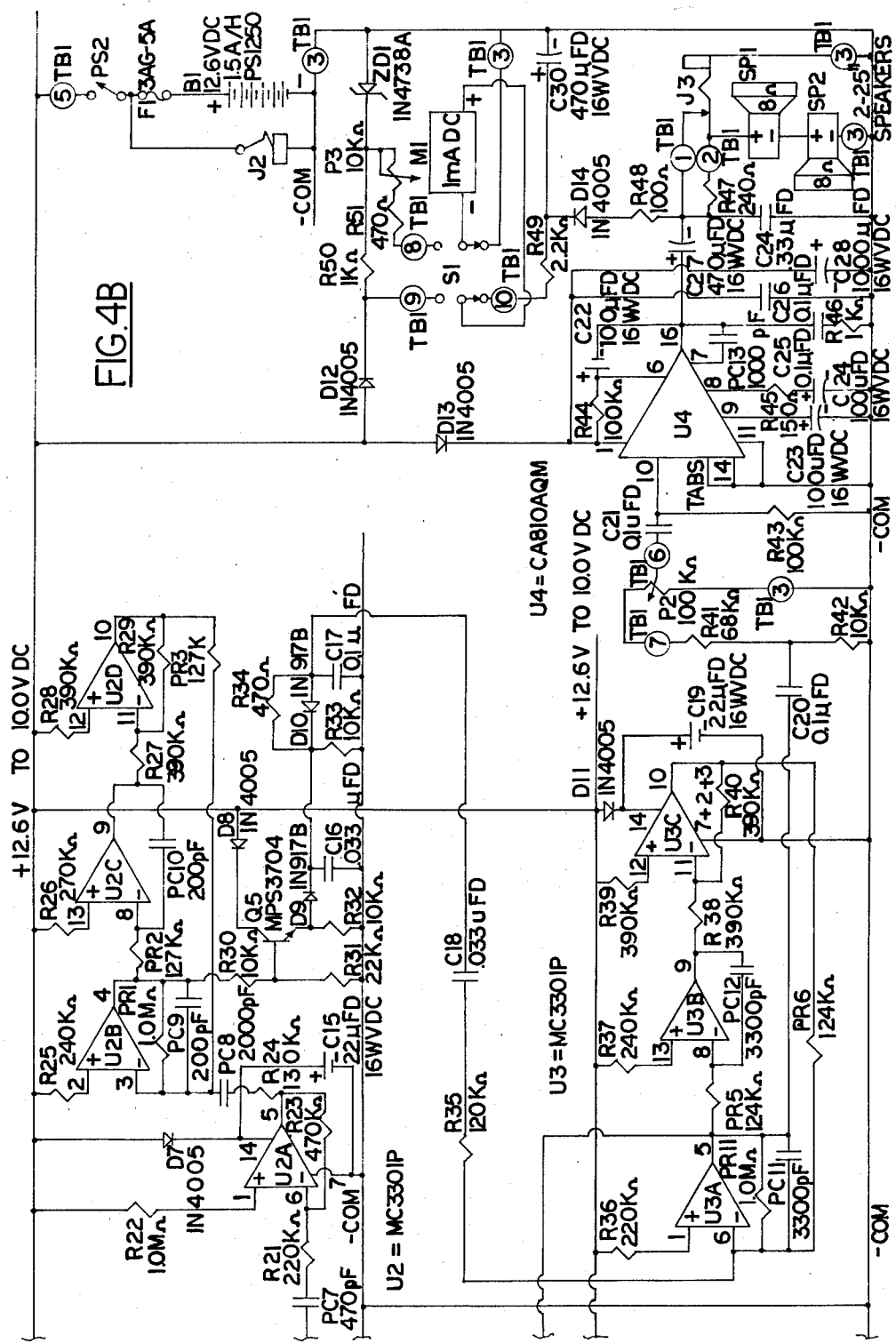
FIG. 4 is a schematic diagram of the receiver.
Figure 7:
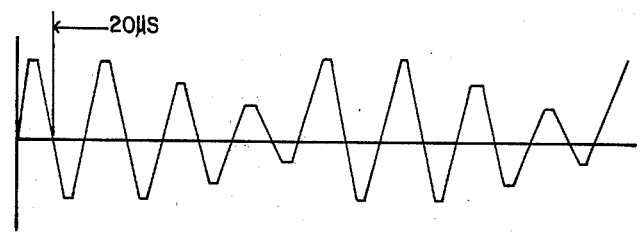
FIG. 7 is a waveform of the input to block 140 of the RC convertor of the receiver.

It consists basically of a transmitter as illustrated in FIGS. 1 and 2, and a receiver as illustrated in FIGS. 3 and 4.

The receiver is dedicated in format and is believed to be fully illustrated by FIGS. 3 and 4 to the extent that any one skilled in the art to which the invention pertains, can easily practice the invention.

The transmitter, illustrated in block diagram form in FIG. 1 and schematically in FIG. 2, is basically comprised of five in-synchronization and in-phase signals derived from one source by binary division, combined in an octal Norgate mixer to give a composite signal embracing R.F. audio and sub audio.

The transmitter requires a highly stable 100 Khz astable supply as indicated by reference character or block 10 in FIG. 1, the astable generator being insensitive to battery voltage or temperature changes.

Block 10

The chip in block 10 is an industrial standard timing circuit used as a 100 Khz astable. The frequency drift for 12.6 Vdc battery to 10.0 Vdc battery is from 99.9 Khz to 100.1 Khz and 0.2% absolute. Temperature stability is accomplished by making PR1 plus PR2, a 1.0 K ohm and 4.99 K ohm ¼ watt, plus or minus 1%, metal film resistors and making PC1 a 1000 pF plus or minus 2% in a Mica capacitor.

This 100 Khz astable output is used as the "Clock Pulse" or "Clock Generator" for the two divide-by-12 in tandem binary dividers block 20.

Block 20

The two chips in block 20 are standard CMOS binary dividers connected in tandem. This gives a possibility of 24 successive binary divisions of the 100 Khz clock pulse. From these 24 successive binary divisions, five have been selected. These are 25 Khz, the carrier or L.F./R.F. frequency; 6.25 Khz, the I.F. frequency; 390.6 Hz, the audible frequency or "beep" tone heard by the operator from the receiver; 12.20 Hz, the frequency to optimize battery life; and 6.10 Hz, the interruption frequency used to optimize the operators hearing as a filter or discriminator.

These five in-sync and in-phase individually are put into block 30, an octal Norgate mixer.

All of the outputs of block 20 share a precise frequency and phase relationship to one another as well as a square wave rise and fall time. This implies easy and predictable de-modulation in the receiver.

Block 30

The one chip in block 30 is a standard CMOS octal Norgate. The NOR statement is the basis upon which the device works. The composite output from the five inputs is a type of a "Digital Modulation" that is believed to be novel.

There are $2 \times 8 \times 16$ output pulses of 20 uS duration each, in the 163840 uS period of the 6.10 Hz repetition rate. This is a total time of $256 \times 20$ uS, or 5120 uS and thus is the time of the signal. The duty cycle is 5120 over 163840 times 100 which yields 3.125%. The Norgate output current capability is in the area 1 ma dc sink or source. Consequently, block 30 drives block 40 and 50 to amplify the current capability from 0.5 ma to 1.5 amp.

Block 40 and 50

The ON and OFF status of power switch block 80 is controlled by blocks 40 and 50. The ON driver block 40, turns the power switch or block ON for a period of 20 uS through the 22 UFD capacitor C8. After 20 uS, the OFF driver block 50, turns the power switch OFF. The power switch may conduct up to 10 amps when ON, hence the requirement for a 1.5 amp ON driver. The current amplifying capability of the blocks 40 and 50 are made from standard transistors and power Darlington transistors.

The expanded "sink" and "source" capability of block 40 and 50 is capacitively coupled by means of capacitor C8 of FIG. 1, to the power transistor block 80.

Block 60

The charging inductor block 60 firstly, is used to charge the capacitive driver source block 70 through the reflected load Z to the battery voltage. Secondly, the charging inductor block 60 prevents the power switch block 80 from shorting out the battery during its 20 uS ON periods. Block 60 is 6 mH inductor at 2 AMP DC.

Block 70

The capacitive driver source block 70 is a standard 1000 UFD capacitor at 16 WVDC. The capacitor is charged to battery voltage through the charging inductor and the reflected load impedance of the matching transformer block 90. When the power switch is ON about $-10$ V of the plus 12.6 V charge appears across the reflected load Z of the matching transformer, which are 256 pulses of 20 uS duration each, over the 6.10 hZ repeating "beep" rate.

Block 80

The power switch is a standard 25 AMP NPN power transistor, capacitively coupled to the ON and OFF drivers through 22 UFD C8. Capacitive coupling insures rapid switching ON and OFF, and also prevents possible "lock on".

The power switch with the 1.5 amp drive can pass 10 amp with a drop across the switch of 1.8 volts. Thus the power switch provides a 10 volt pulse into a load as low as 1.0 ohm.

Block 90

The matching transformer is used as an auto transformer that provides output voltage step up in five steps.

Step 1 is a direct coupling mode pulse voltage in 10 V to 12 V.
Step 2 is a step up of 2.0 to 1, or 20 V to 29 V.
Step 3 is a step up of 3.5 to 1, or 35 V to 50 V.
Step 4 is a step up of 8.0 to 1, or 80 V to 120 V.
Step 5 is a step up of 18 to 1, or 180 V to 300 V.

The matching transformer is used to provide more signal current to high Z loads.

Included with the matching transformer is a meter device to indicate which of the five settings is the optimum for the load being driven. This meter device also can be used to relate battery status to the operator.

Reasons for Usage of Multiple Frequencies

The use of the five frequencies, itemized in numerical order:
1. Fault finding with accuracy.
2. Less susceptible to interference.
3. Superior noise rejection.
4. Reducing battery drains.
5. Minimum chance of misinterpretation.

Listed below are some of the attributes of the five frequencies used individually on a frequency basis.

1. 25 Khz

25 Khz is the first repetitive encodement which acts as the carrier medium. This gives the system the properties of R.F. in buried service applications. To be specific, it gives the device its fault finding characteristics, and its highly accurate map confirmation abilities. The 25 Khz R.F. repetition rate is low enough in frequency to give ranges up to a radius of ½ mile from the transmitter when being used from a vehicle.

2. 6.25 Khz

The 6.25 Khz sub-encoding repetition rate acts as a I.F. frequency. It gives the system the superior noise rejection and freedom from misinterpretation. In other words, the noise pulse must possess a 25 Khz rise time and 6.25 kHz repetition rate in order to get through the dual filtering.

3. 390.6 Hz

The 390.6 Hz sub-encoding repetition rate gives the system the audible tone that the operator hears. It also carries in its amplitude, the signal strength characteristics of the 25 Khz and 6.25 Khz higher encodements. This gives to the operator a tone, the volume of which is directly related to the strength of the signal on the buried service beneath him.

Secondly, it reinforces the action of the 25 Khz and 6.25 Khz filters preceding it. This makes it necessary for a noise pulse to possess three characteristics in order to get through to the operator. A noise pulse must have a rise time of 25 Khz and the repetition rate of 6.25 Khz and 390.6 Hz. If it possesses these three traits or characteristics, it might be misinterpreted by the operator for a signal rather than noise.

4. 12.20 Hz

The 12.20 Hz sub-encoding repetition rate gives to the system the ability to efficiently use battery power. By non-symmetrically chopping the 6.10 Hz tone burst with 12.20 Hz through a Norgate, the battery drain is reduced by a factor of 0.50 compared to a symmetrical 6.10 Hz alone.

5. 6.10 Hz

The 6.10 Hz sub-encoding repetition rate gives to the system the ability of easy interpretation. An interrupted time allows the operator to discriminate between different volume levels. Secondly, it uses the operator's ear as a fourth and final filter. The fourth filtering action makes for a very unlikely misinterpretation of noise for signal.

Reference should next be made to FIGS. 3 and 4 which illustrate the receiver. The receiver is one half of a matched set. Receivers basically consist of a series of sequential filters, each tuned to one of the three highest encodements of the Norgate modulated transmitter. This precise encodement and decodement gives the superior interference rejection and freedom from misinterpretation to the the operator of the device.

Block 100—Antenna Coils 1 of 3

There are three antennae usable, each of which is wound for 12 mH inductance. The coil is resonated in series with 3300 pF, plus or minus 2% and 4.7 K ohm. This forms a resonant series circuit with a Q of 0.5.

Antenna #1

A 6"×6" air wound coil, mounted at the top of the receiver cases. This antenna is intended for "on foot" work in strong signal areas and is useful in buried cable work.

Antenna #2

A 1¾" long×⅜" diameter coil on a ferrite rod 7" long ⅜" diameter, all mounted in a plastic wand housing. This antenna is intended for "on foot" work which involves precision, or where great distances are involved. This antenna can also be used to confirm "on foot" faults found with mobile vehicle use with Antenna #3.

Antenna #3

A 18"×8" air wound coil, mounted in a masonite holder with attaching hardware for mounting to the underside of the bumper or other suitable structure of a vehicle, parallel to the road. Intended for mobile use in fault locating on gas distribution main or buried cable. Can be used at speeds up to 15 mph with the receiver on AUTO-FAST.

Block 110 25 Khz Tuned Stage

Block 110 is a standard transistor circuit with 25 Khz parallel resonant load in the collector output. The circuit discriminates more precisely the input from the series resonant antenna. This block 110 plus blocks 140 and 6.25 Khz active filter, and block 170, the 390.6 Hz active filter, provide the receiver with an overall Q in the area of 20. This triple sequential filtering gives the superior noise rejection to the device.

Block 120—Variable Gain Stage

The carrier 25 Khz has a gradual taper along the conductive path as the operator goes away or comes towards the transmitter. Block 120 provides a stage which can nullify this taper by providing either a "loss" or a "gain" in response to a control signal. The control signal comes in one of two modes:

1. Manual—that is programmed by the position in degrees of the sensitivity control. In order to be changed, the operator turns the control, the response will be heard with block 200 and seen, if desired, with block 210.

2. Auto—an automatic system of feedback which allows "Hands Off" operation. The system adjusts the gain over "time" to compensate for distance of travel. However, because of a time factor, faults, with their sharp or abrupt drop or rise, are not masked and appear as a change. The time factor or rate comes in two constants, one for walking speed and the other for vehicle speed.

The output of block 120 drives block 130.

Block 130—Untuned RC Coupled Stages

Block 130 consists of two standard RC coupled amplifying stages with a gain per transistor of Av equals 15. The combined gain is 225, this gives a nominal output on auto of 1.25 Vpp. Block 130's 1.25 Vpp output drives block 140.

Block 140—RC Converter

Figure 8:
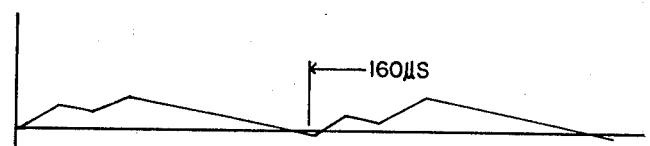
FIG. 8 is a waveform drawing of the output which drives block 150 or the 6.25 Khz filter of the receiver.

Block 140 is a standard emitter follower transistor circuit driving a RC circuit through a diode. This conversion factor is a Av of 0.25. The input is similar to that shown in FIG. 8. The output drives block 150.

Block 150—6.25 Khz Filter

Block 150 is a standard active filter made from Norton amplifiers and the center frequency is 6.25 Khz. Consistency of center frequency is assured by using plus or minus 2% mica capacitors and plus or minus 1% metal film resistors where required.

Block 160—RC Converter

Block 160 is a standard emitter follower transistor circuit driving a RC circuit through a pair of diodes.

Figure 9:
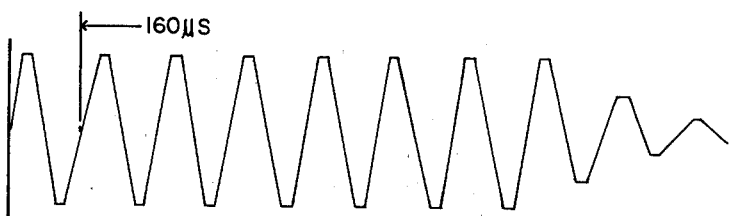
FIG. 9 is a waveform drawing of the input to block 160 of the RC convertor of the receiver.
Figure 10:
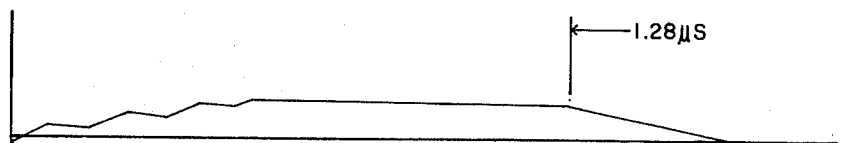
FIG. 10 is a waveform drawing of the output of block 160 which drives block 170 or the 390.6 Hz filter of the receiver.

The input to block 160 resembles that shown in FIG. 9 and the output resembles that of FIG. 10 and drives block 170.

Block 170—390.6 Hz Filter

Block 170 is a standard active filter made from Norton amplifiers with a center frequency of 390.6 Hz. Consistency of center frequency is assured by making all critical components from mica capacitors or metal film resistors. The output of block 170 drives the volume control through a scaling and decoupling set of resistors.

The output of block 170 is also used as feedback "directly" to block 220—the sensitivity control. When on AUTO, these blocks 220 and 230 vary over "time" the gain of block 120 so that the output of block 170—the 390.6 Hz filter, tries to remain at 2 Vpp. However, sudden abrupt "rises" or "drops" in "signal picked up" will be conveyed unmasked through to blocks 200 and 210—the audible and visual converters. Thus, the gradual taper of signal "picked up" will be corrected for, and go unnoticed, but faults will be conveyed to the operator.

Block 180—Volume Control ON-OFF

Block 180, the volume control, serves two functions which are as follows:

1. It provides the method of turning the receiver ON and OFF through the switch.
2. It provides one method of adjusting the output of block 190—the power amplifier. The other method is block 220—the sensitivity control when it is on manual.

Block 190—Power Amplifier

Block 190 is a standard power amplifier in chip form used to deliver up to 0.5 W rms "undistorted" into a 16 ohm Load, block 200. Block 190 also through the slide switch, can drive or deflect the meter block 210 in proportion to the volume produced by block 200.

Block 200 and 210—Audible and Visual Translators

Block 200 and 210 are the means by which the electronic information which the receiver is picking up is converted into information the operator can understand. Both hearing and visual senses can be used, if desired.

Block 220—Sensitivity Control Auto Manual

Block 220, the sensitivity control, serves two functions, which are as follows:

1. Provides through the switch, the ability to select the mode of sensitivity adjustment. Switch OFF is "auto", useful in mobile work with the time slide switch on "fast" or for "on foot" work with the slide switch on "slow". Auto allows for quick locating of "faults" without having to compensate for the gradual taper. Once a suspected "fault" is found, then the operator can switch to manual and adjust the sensitivity to the desired "fixed gain value" to confirm and pinpoint the fault.

Block 230—Gain Control Generator

Block 230, is the electronic means of translating the Auto/Manual commands, and the Fast/Slow commands of the operator into a signal for controlling the gain of block 120.

It is the controllable sensitivity with timed AGC combined with the three antennae options that makes the device a useful and convenient tool.

In comparing the present device with other previous devices, improvements include the ability to find faults, strict adherence to primary path, satisfactory range so that it can be used from a moving vehicle and ease of interpretation of audio tone with a minimum hearing fatigue.

Disadvantages of other designs include ambiguous enunciation of faults because the frequency is in the audio range and re-radiation of signal from primary path and adjacent conductive paths which may be indistinguishable.

Method of Use

Transmitter:

The transmitter is provided with two output terminals which by the means of two connecting lead wires (not illustrated), allows the transmitter to be electrically connected to a pipe or a cable and a ground return reference. The 5 position rotary switch S2 in conjunction with the meter M1 on the transmitter selected to display output power, is rotated through its 5 settings to select the one that causes the greatest meter deflection. At this setting the transmitter is putting out the best or greatest signal power or signal current and this is the setting used to operate the device.

This signal current has A.C. characteristics dictated to it by its NorGate modulated transmitter originating source. Current, by the laws of electro magnetics, always sets up a radiating magnetic field at right angles to the direction of flow thereof. This magnetic field possesses all the same characteristics as the originating current, i.e. the AC current. Thus the magnetic field is a mirror image of the originating current, whose parameters are dictated by the NorGate modulated transmitter and the physical characteristics of the conductive pipe or cable on which it is traveling on or along, in an attempt to complete a loop back to the ground return. Thus, if on this pipe or cable, there is a good ground return or fault point, by the very nature of its AC characteristics given to it by its NorGate modulated transmitter, the majority of the current will go down the conductive path or pipe of the ground fault and then return through the soil widely dispersed to the ground return lead of the transmitter. The magnetic field caused by the concentrated pipe current possesses all the same characteristics as the originating current. Thus, up to the point of the ground fault on the pipe, there is a strong radiating magnetic field, and beyond this point, due to a lack of AC current, there is an accompanying lack of magnetic field. By using a receiver, equipped with a loop coil type antenna (block 100), Maxwells equations on inducted EMF apply. Thus the voltage induced into the loop coil type antenna is a mirror image of its originator, the radiating magnetic field, which in turn is a mirror image of its originator, the AC current. Thus an operator using a receiver to trace the path of a concentrated current carrier, i.e. the pipe, to which one side of the transmitter is connected, will be led by the majority of the AC current along the run or course of the pipe, to the ground fault. The NorGate or NandGate modulation as employed in the transmitter allows the creation of a AC current generator (transmitter) that produces a current that, by it frequency and multiplicity of subencodements, exhibits several advantageous traits.

A. A signal whose carrier or highest frequency encodement imparts to it some of the characteristics of radio frequencies. This trait allows for the superior ability to detect or select ground faults or points along a conductive path such as a coated steel pipe or a cable.

B. A signal whose carrier frequency and multiplicity of sub-encodements allows the use of a receiver which exhibits higher degrees of sensitivity, selectivity, noise immunity and freedom from misinterpretation by the operator. This is possible because of the multiplicity of sub-encodement rates offered by the NorGate modulation method allowing the receiver to have 2 or 3 or more stages of filtering and amplification, each at a different frequency, within the restraints of the original NorGate modulation sub-encodement frequencies.

Other designs are prone to noise interference and the audio tone chosen (because of required design parameters) is often at a frequency annoying to the ear of the operator. Furthermore, the range is often limited.

In the present design, the primary operating frequency is in the R.F. range with square wave rise time making it primarily suited for fault finding and giving it strict adherence to the primary path.

In other designs, the primary frequency is in the audio range and it may or may not have square wave rise time. Because of the nature of the audio wave length, all return paths are of relatively the same impedance so that the instrument cannot always differentiate precisely thereby causing problems in fault finding and in primary path tracing.

The present device utilizing the R.F. frequency all but eliminates noise interference due to the use of sequentially sub-encoded transmitter frequencies together with dedicated decoding in the receiver. The choice of the frequencies of the present device gives an audio tone at the output that is easy to interpret and minimizes hearing fatigue.

Other designs utilize audio frequencies which are closer to the primary sources of interference and the single frequency designs makes them more susceptible to any noise pulses which may share similar rise times.

In other designs, the audio tone may be the carrier tone. Therefore, the problem is to keep the audio tone as far away as possible from primary sources of noise interference yet within normal bounds of human hearing. This means that improved noise rejection may mean higher audio tones, which in turn create operator aggravation. If, by contrast, the audio tone is improved to the operator's ears, then the susceptibility to noise would be increased.

The multi-frequency design of the present transmitter enables the dedicated receiver to operate at much higher gains thereby giving greater range and enabling use from a moving vehicle whereas conventional single frequency designs, by their very nature, limit the maximum gain at which the receiver can be operated thereby limiting the range.

Figure 6:
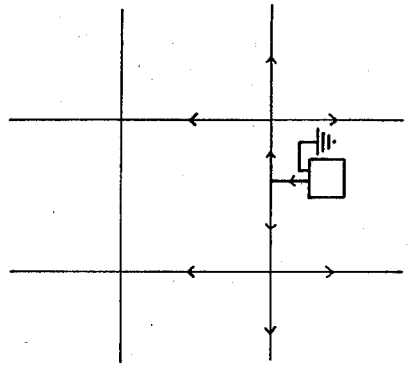
FIG. 6 is a schematic diagram showing the device in use as a pipe or conduit tracing device.
Figure 5:
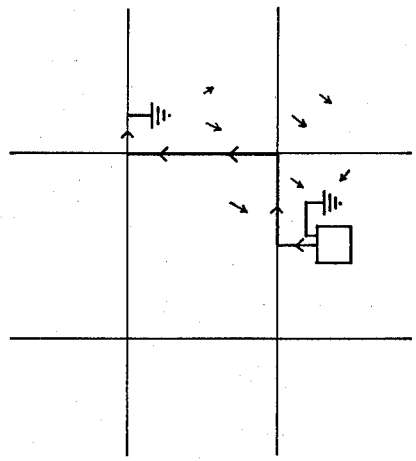
FIG. 5 is a schematic diagram showing the device in use as a ground seeking device.

Finally, reference should be made to the schematic diagrams of FIGS. 5 and 6. FIG. 5 shows the device being used as a fault finding device or ground seeking device in which the signal is impelled directly towards a ground point because of its frequency possessing more RF traits.

FIG. 6 shows the device used as a pipe or conduit tracing device.

It should be appreciated that all of the parts, values and chosen frequencies in this disclosure are exemplary only and should not be construed as limiting.

To summarize, it is the NorGate means of encodement in the transmitter, that permits a plurality of filtering in the receiver, the combination of which gives the system all its advantages over conventional techniques now in use.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

What I claim as my invention is:

1. A ground fault locating device for cathodically protected steel conduits and the like comprising in combination a Norgate modulated transmitter and a receiver, said transmitter including:
   (a) the source of power,
   (b) frequency generating means operatively connected to said source of power,
   (c) means operatively connected to said frequency generating means to produce a plurality of binary divisions of the frequency generated by said frequency generator means,
   (d) means operatively connected to a selected number of frequencies to produce a composite output therefrom,
   (e) a power switch circuit,
   (f) ON and OFF drive means operatively connected to said composite output and said power switch circuit, to control said power switch circuit,
   (g) a capacitive driver source,
   (h) means to power said capacitive driver source operated by said power switch circuit, and
   (i) means operatively connecting said capacitive driver source to the load of said transmitter, said receiver adapted to receive the signals transmitted by said transmitter.

2. The invention according to claim 1 in which said frequency generator means comprises a binary counter divider.

3. The invention according to claim 1 in which said means operatively connected to a selected number of frequencies to produce a composite output therefrom, comprises a Norgate circuit.

4. The invention according to claim 2 in which said means operatively connected to a selected number of frequencies to produce a composite output therefrom, comprises a Norgate circuit.

5. The invention according to claim 1 in which said ON and OFF drive means includes means to amplify the signals from said means producing a composite output.

6. The invention according to claim 2 in which said ON and OFF drive means includes means to amplify the signals from said means producing a composite output.

7. The invention according to claim 3 in which said ON and OFF drive means includes means to amplify the signals from said means producing a composite output.

8. The invention according to claim 4 in which said ON and OFF drive means includes means to amplify the signals from said means producing a composite output.

9. The invention according to claim 1 in which said means to power said capacitive driver source includes a charging inductor circuit, said ON and OFF drive means being capacitively connected to said power switch circuit.

10. The invention according to claim 2 in which said means to power said capacitive driver source includes a charging inductor circuit, said ON and OFF drive means being capacitively connected to said power switch circuit.

11. The invention according to claim 3 in which said means to power said capacitive driver source includes a charging inductor circuit, said ON and OFF drive means being capacitively connected to said power switch circuit.

12. The invention according to claim 4 in which said means to power said capacitive driver source includes a charging inductor circuit, said ON and OFF drive means being capacitively connected to said power switch circuit.

13. The invention according to claim 5 in which said means to power capacitive driver source includes a charging inductor circuit, said ON and OFF drive means being capacitively connected to said power switch circuit.

14. The invention according to claim 6 in which said means to power said capacitive driver source includes a charging inductor circuit, said ON and OFF drive means being capacitively connected to said power switch circuit.

15. The invention according to claim 7 in which said means to power said capacitive driver source includes a charging inductor circuit, said ON and OFF drive means being capacitively connected to said power switch circuit.

16. The invention according to claim 8 in which said means to power said capacitive driver source includes a charging inductor circuit, said ON and OFF drive means being capacitively connected to said power switch circuit.

17. The invention according to claims 1, 2 or 3 which includes a matching transformer between said capacitor drive source and the output of said transmitter.

18. The invention according to claim 1 in which said selective frequencies include an R.F. carrier frequency, an I.F. frequency and an audible tone frequency.

19. The invention according to claim 18 in which said transmitter produces a plurality of repetitive encodement signals acting upon the carrier frequency, said receiver including a series of sequential filters each tuned to one of said encodement signals for decodement thereof and audible and visual transducers operatively connected to said filters.

20. A ground fault locating device for cathodically protected steel conduits and the like comprising in combination:
(a) a Norgate modulator transmitter, and
(b) a receiver therefor, said transmitter including:
(c) a source of power,
(d) a clock generator operatively connected to said source of power,
(e) a binary counter divider circuit operatively connected to the said clock generator, said binary counter divider circuit providing a plurality of binary divisions or frequencies from the basic frequency of the clock generator,
(f) means operatively connected to a selected number of said frequencies to produce a digital modulation or composite signal, said means including:
(g) a Norgate circuit,
(h) ON and OFF switch driver circuits operatively connected to the composite signal, said switch driver circuits amplifying the output of said composite signal,
(i) a power switching circuit capacitively connected to said switch driver circuits,
(j) a charging inductor circuit operatively connected to said power switch circuit, and
(k) a capacitor drive source chargeable by said power inductor circuit, and
(l) means operatively connecting said capacitive driver source to the load of said transmitter, said receiver receiving and decoding at least one of the emcodements of said transmitter.

* * * * *